United States Patent [19]

O'Breartuin et al.

[11] Patent Number: 4,950,918

[45] Date of Patent: Aug. 21, 1990

[54] ISOLATED CONTROL CIRCUIT FOR ALTERNATING CURRENT SWITCHES

[75] Inventors: Ciaran O'Breartuin, St. Louis County, Mo.; Marco Venturini, Genoa, Italy

[73] Assignee: Emerson Electric Co., St. Louis, Mo.

[21] Appl. No.: 280,825

[22] Filed: Dec. 7, 1988

[51] Int. Cl.$^5$ .................... H03K 17/56; H03K 17/60; H03K 3/01; G05F 1/40

[52] U.S. Cl. .................................. 307/242; 307/254; 307/270; 323/289

[58] Field of Search ............... 307/242, 253, 254, 270, 307/300; 323/289

[56] References Cited

U.S. PATENT DOCUMENTS 4,609,980 9/1986 Hoffman .............................. 323/289
4,837,457 6/1989 Bergstrom et al. ................. 307/253

Primary Examiner—John S. Heyman
Assistant Examiner—Trong Quang Phan
Attorney, Agent, or Firm—Polster, Polster and Lucchesi

[57] ABSTRACT

A drive circuit controls application of alternating current power to a load. The drive circuit includes an oscillator which applies a high frequency signal to a first input of a logic gate. A control signal is applied to a second input of the gate to enable the gate. A first capacitor is connected to the output of the logic gate. A rectifier connected to the first capacitor rectifies the signal from the first capacitor. A low-pass filter connected to the rectifier removes the high frequency components from the signal. A solid state switch has a switching input connected to the low-pass filter output, which switches the device into a conducting state. This circuit is particularly suited for use where many solid state switches share the same common terminal.

18 Claims, 1 Drawing Sheet

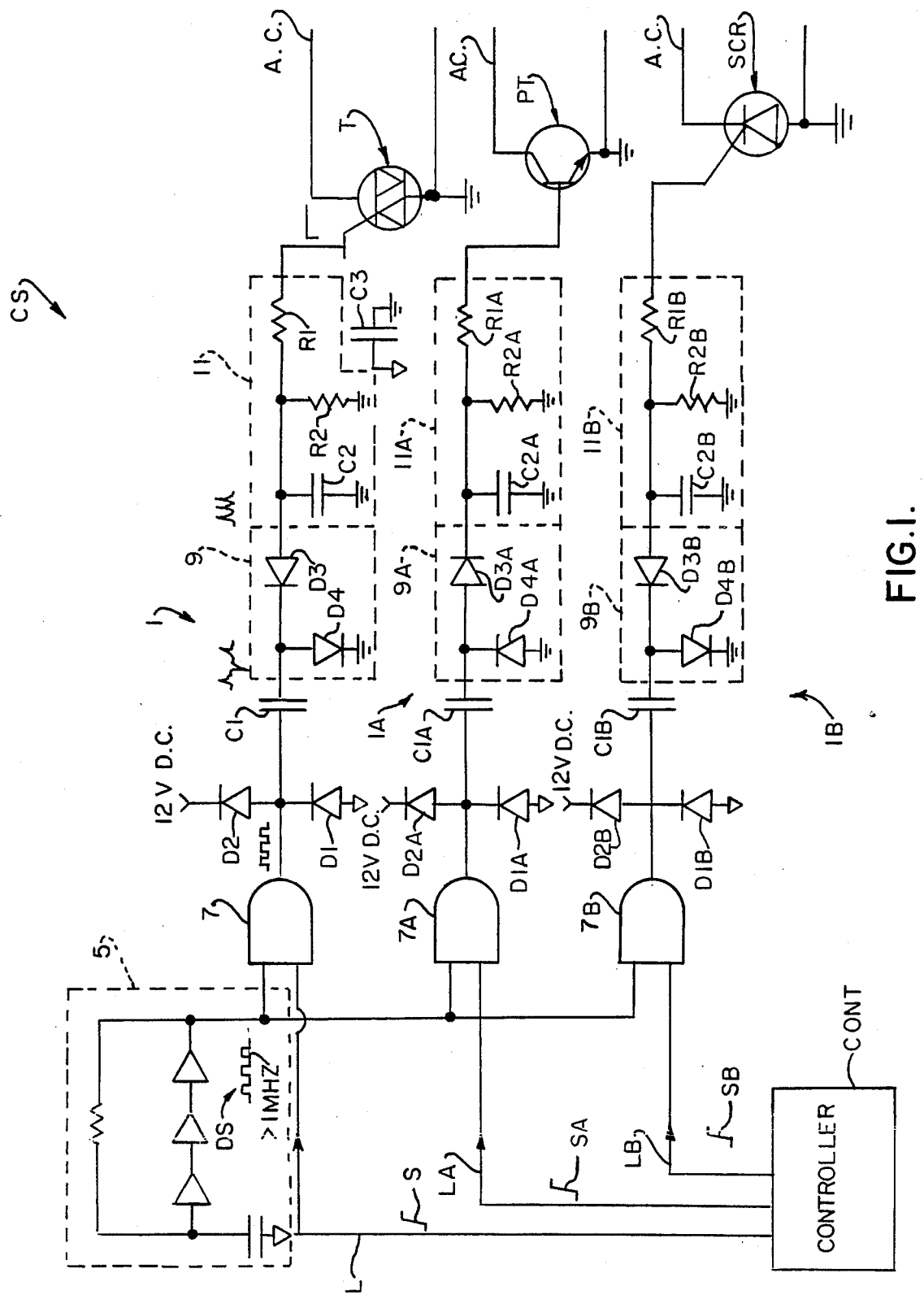
FIG.I.

ISOLATED CONTROL CIRCUIT FOR ALTERNATING CURRENT SWITCHES

BACKGROUND OF THE INVENTION

This invention relates to control circuits for solid state switches and, more particularly, to a control circuit which is isolated from the alternating current (AC) line which the switch controls.

In designing control systems for AC switches, transfer of control commands from a controller to the AC switches is a common design problem. Whenever solid state switches such as silicon controlled rectifiers (SCRs), triacs, or power transistors are used, the switch control terminal is not isolated from the AC line and is therefore live. The controller, on the other hand, normally must be isolated from the AC line for safety reasons, and, in any event, is usually referenced to another line potential. Another common problem is that the drive or control terminals of solid state switches require low voltage power which must be made available to each switch.

Traditional solutions to these design problems involve the use of opto-couplers (which provide isolation) in combination with transformers, capacitors or various other types of dissipative circuitry (which carry power at the solid state switch level). As an alternative, individual high frequency transformers are used to both carry the control signal and provide the drive power. However, all of these solutions are expensive and complex and the former also suffers from limited reliability.

The problems existing with traditional solutions are even more acute when considered in connection with the design of appliance controllers. Such controllers are characterized by a high number of low power, low cost solid state switches, very stringent cost requirements, and high reliability standards. The existing solutions in this environment all fail to meet at least one of the requirements of an acceptable controller.

SUMMARY OF THE INVENTION

Among the several objects and features of the present invention may be noted the provision of an improved drive circuit for appliance controllers.

Another object is the provision of such a circuit which can be used with a large number of low power, low cost, solid state switching devices.

A third object is the provision of such a drive circuit which is highly reliable.

A fourth object is the provision of such a drive circuit which can be implemented at low cost.

A fifth object is the provision of such a drive circuit which is readily adaptable to controlling a multitude of solid state switching devices, such as SCRs, triacs and power transistors.

Other objects and features will be in part apparent and in part pointed out hereinafter.

Briefly, in a first aspect of the present invention a control system employs a solid state switching device to control application of alternating current power to a load. A drive circuit applies a low voltage power signal to the solid state switching device and provides isolation from the alternating current. The drive circuit includes an oscillator for generating a drive signal of a predetermined frequency. A logic gate has as a first input the drive signal from the oscillator and as a second input a control signal for enabling the gate to pass the drive signal. A first capacitor is connected to the output of the logic gate and the drive signal is applied to it. A rectifier is connected to the first capacitor for rectifying the signal from the first capacitor. A low-pass filter is connected to the rectifier. The filter includes a second capacitor whose capacitance has a specified ratio to the capacitance of the first capacitor. The output of the filter is connected to the solid state device to switch the device to a conducting state when the logic gate is enabled.

In a second aspect of the present invention, a drive circuit for controlling application of alternating current power to a load includes an oscillator for generating a drive signal of a predetermined frequency. A logic gate has as a first input the drive signal from the oscillator and as a second input a control signal for enabling the gate to pass the drive signal. A first capacitor is connected to the output of the logic gate and the drive signal is applied to the capacitor. A rectifier is connected to the first capacitor for rectifying the signal from the first capacitor. A low-pass filter is connected to the rectifier. The filter includes a second capacitor whose capacitance has a specified ratio to the capacitance of the first capacitor. A solid state switching device has a control input terminal connected to the output of the filter. The drive signal is applied to the control input terminal when the logic gate is enabled, which switches the device into a conducting state in which AC power is applied to the load.

In a third aspect of the present invention, a control system which controls the application of alternating current power to a load includes a solid state switching device having a pair of load terminals adapted for connection in series with a load in an alternating current circuit. The switching device also has a control terminal for controlling conduction of current through the load terminals. An oscillator generates a high frequency waveform. A logic gate having a pair of inputs and at least one output has the high frequency waveform applied to one of its inputs. A controller selectively applies an enable signal to the other input of the logic gate to permit the high frequency waveform to pass through the logic gate while the enable signal is present. A conversion circuit converts the output of the logic gate to a substantially dc voltage signal which is supplied to the control terminal of the solid state switching device to cause conduction through said device only when the controller applies the enable signal to the logic gate.

BRIEF DESCRIPTION OF THE DRAWING

The sole FIGURE is an electrical schematic of a drive circuit of the present invention for use with one or more solid state switching devices.

DESCRIPTION OF THE PREFERRED EMBODIMENT

Referring now to the FIGURE, a control system CS of the present invention employs one or more solid state switching devices (three such devices are shown) to control application of alternating current power to one or more loads (not shown). There is typically one switching device per load. The solid state switching devices may, for example, be a triac T, a power transistor PT, or a silicon controlled rectifier SCR. The control system is typically employed in an electrical appliance such as a washing machine. It includes a controller CONT for controlling operation of the various components within the appliance, including controlling the solid state switching devices.

A drive or control circuit 1 of the present invention applies a low voltage power signal to the topmost solid state switching device T. It is a feature of the invention that the controller is electrically isolated from the AC power line by the drive circuit. Additional drive circuits 1A and 1B, identical in construction to circuit 1, are provided for controlling power transistor PT and the SCR respectively. In the present invention, the number of drive circuits is the same as the number of AC switches to be controlled. For example, if only triac T were to be controlled, there would be only one drive circuit. On the other hand, if in addition to the three switching devices shown in FIGURE 1 another switching device were to be controlled, another drive circuit 1C (not shown) would be added. Since all drive circuits are identical in construction, only drive circuit 1 is described in detail. Similar parts in the other drive circuits are indicated by the letters "A" and "B" respectively which are used in connection with the reference numerals.

The drive circuits share a high frequency oscillator 5. The oscillator generates a drive signal DS of a predetermined frequency which is at least 1 MHz.

A logic gate 7, which is preferably an AND gate, has as a first input the drive signal from oscillator 5. Gate 7 has, as a second input, a control signal S. This control signal is generated by controller CONT and is supplied to the second input of gate 7 on a line L. Controller CONT generates control signal S depending upon the function within the appliance which is to be performed at a particular period of time. The application of control signal S to the second input of gate 7 enables gate 7 to pass drive signal DS.

A capacitor C1 is connected to the output of gate 7. Capacitor C1 is a high voltage capacitor having a very low capacitance value. Interposed between the output of gate 7 and capacitor C1 is a first diode D1 which is connected between the circuit path and controller common. A second diode D2 is connected between the circuit path and a DC voltage line, for example a twelve-volt DC line. These diodes are protective and limit the maximum voltage excursions which can appear at the output of gate 7.

Capacitor C1 is connected to a rectifier means 9 which comprises a full wave rectifier. The rectifier includes a diode D3 connected in the circuit path and a diode D4 connected between the path and ground (ground being the common of the solid state switching device). The full wave rectified output of rectifier means 9 is supplied to a low-pass filter 11. Filter 11 includes an in-line resistor R1, a resistor R2 connected between the circuit path and ground, and a second capacitor C2 having a capacitance which is relatively high when compared to that of capacitor C1. The capacitance of capacitor C1 as a ratio to the capacitance of capacitor C2 is typically 1:1000 or so.

The output of filter 11 is connected to the switching or control input terminal of the solid state switching device. The output of the filter switches the device into a conducting state, whereby AC power is supplied to the load within the appliance, whenever the control signal S from controller CONT goes High. A capacitor C3 having a small capacitance is connected between the common of controller CONT and the corresponding common of the solid state switch to provide a return path for the high frequency AC power.

In operation, when a control signal CS enables gate 7, the high frequency AC drive signal DS is supplied to high voltage capacitor C1. The high frequency AC signal is full wave rectified and supplied to low-pass filter 11. The output of the low-pass filter is then a low frequency (DC) signal provided to the switching input of the solid state device. The ratio of capacitors C1 and C2 is low enough that no single sweep of the voltage difference in the drive signal would accumulate enough charge on capacitor C2 to turn solid state switch on. The circuit is therefore able to switch the device to its conducting state only when gate 7 is enabled.

The solid state switches are all independently switched into their conducting state for AC power to be supplied to the corresponding separate loads. The drive signal generated by oscillator 5 is commonly supplied to the first input of a logic gate associated with each drive circuit. Separate control signals SA and SB are independently generated by controller CONT and supplied to the respective second inputs of logic gates 7A and 7B. When enabled, the drive signal corresponding to that particular gate is supplied to the appropriate solid state switch in the manner previously described to switch the device into its conducting state, whereby AC power is provided to the corresponding load.

What has been described is a drive circuit which can be used with one or more solid state devices with each drive circuit being electrically isolated from an AC power line. The drive circuit is relatively simple and utilizes low cost, standard, highly reliable components.

In view of the above it will be seen that the various objects and features of the present invention are achieved and other advantageous results obtained.

As various changes could be made in the above systems without departing from the scope of the invention, it is intended that all matter contained in the above description or shown in the accompanying drawings shall be interpreted as illustrative and not in a limiting sense.

Having thus described the invention, what is claimed and desired to be secured by Letters Patent is:

1. In a control system employing a solid state switching device to control application of alternating current power to a load, the improvement comprising drive circuit means for applying a low voltage power signal to the solid state switching device, the drive circuit means providing isolation from the alternating current, said drive circuit means including:
   oscillator means for generating a drive signal of a predetermined frequency;
   a logic gate having as a first input the drive signal from the oscillator means and as a second input a control signal from a control means for enabling the gate to pass the drive signal;
   a first capacitor connected to the output of the logic gate and to which the drive signal is applied;
   rectifier means connected to the first capacitor for rectifying the signal from the first capacitor; and
   a low-pass filter connected to the rectifier means, said filter including a second capacitor whose capacitance has a specified ratio to the capacitance of the first capacitor, the output of the filter being connected to the solid state device to switch the device to a conducting state when the logic gate is enabled.

2. The drive circuit of claim 1 wherein the oscillator means generates a drive signal having a frequency of at least 1MHz.

3. The drive circuit of claim 2 wherein the filter is solely comprised of passive components.

4. The drive circuit of claim 2 wherein the ratio of the capacitance of the first capacitor to the capacitance of the second capacitor is approximately 1:1000.

5. The drive circuit of claim 3 wherein the logic gate comprises an AND gate.

6. The drive circuit of claim 5 wherein the control system utilizes a plurality of solid state switches, each of which is independently driven, and the drive circuit means includes a separate logic gate, first capacitor, rectifier means and filter for each switch, the drive signal from the oscillator being commonly supplied to one input of each logic gate and a separate control signal being supplied to a second input of each logic gate to separately enable that gate to pass the drive signal.

7. A drive circuit for controlling application of alternating current power to a load comprising:
oscillator means for generating a drive signal of a predetermined frequency;
a logic gate having as a first input the drive signal from the oscillator means and as a second input a control signal from a control means for enabling the gate to pass the drive signal;
a first capacitor connected to the output of the logic gate and to which the drive signal is applied;
rectifier means connected to the first capacitor for rectifying the drive signal;
a low-pass filter connected to the rectifier means, said filter including a second capacitor whose capacitance has a specified ratio to the capacitance of the first capacitor; and,
a solid state switching device having a control input terminal connected to the output of the filter, the drive signal being applied to the control input terminal, when the logic gate is enabled, to switch the device into a conducting state in which AC power is applied to the load.

8. The drive circuit of claim 7 wherein the solid state device is a silicon controlled rectifier.

9. The drive circuit of claim 7 wherein the solid state device is a triac.

10. The drive circuit of claim 7 wherein the solid state device is a power transistor.

11. The drive circuit of claim 7 further including a plurality of solid state devices for independently controlling application of AC power to separate loads.

12. The drive circuit of claim 11 wherein each solid state device has an associated drive circuit comprising a logic gate, first capacitor, rectifier means and filter, the drive signal from the oscillator means being commonly applied to one input of each logic gate and separate, independent control signals being applied to a second input of each gate to independently enable that gate to pass the drive signal.

13. A control system for controlling the application of alternating current power to a load, comprising:
a solid state switching device having a pair of load terminals connected in series with a load in an alternating current circuit, said switching device also having a control terminal for controlling conduction of current through the load terminals;
oscillator means for generating a high frequency waveform;
a logic gate having a pair of inputs and at least one output, the high frequency waveform being applied to one of the inputs of the logic gate;
controller means for selectively applying an enable signal to the other input of the logic gate to permit the high frequency waveform to pass through the logic gate while the enable signal is present;
conversion means for converting the output of the logic gate to a substantially dc voltage signal, said dc voltage signal being supplied to the control terminal of the solid state switching device to cause conduction through said device only when the controller means applies the enable signal to the logic gate.

14. The control system as set forth in claim 13 wherein the converting means consists of passive components.

15. The control system as set forth in claim 13 wherein the output of the logic gate is a square wave, said conversion means including a capacitor connected to the output of the logic gate so as to differentiate the square wave output of the logic gate.

16. The control system as set forth in claim 15 wherein the conversion means further includes a low-pass filter connected between the capacitor and the control terminal of the switching device.

17. The control system as set forth in claim 13 wherein the system includes a plurality of solid state switching devices, said system having only one oscillator means and having separate logic gates and separate conversion means for each switching device.

18. The control system as set forth in claim 17 wherein the system has only one controller means, said controller means selectively applying separate, independent enable signals to each of the logic gates.

* * * * *